United States Patent

Matsumura et al.

Patent Number: 5,260,161
Date of Patent: Nov. 9, 1993

[54] PHOTOSENSITIVE COMPOSITION AND PHOTOSENSITIVE LITHOGRAPHIC PRINTING PLATE COMPRISING IN ADMIXTURE A TETRAPOLYMER AND A DIAZO RESIN

[75] Inventors: Toshiyuki Matsumura; Shinichi Matsubara; Masafumi Uehara, all of Hino; Shinichi Bunya; Eriko Katahashi, both of Yokohama, all of Japan

[73] Assignees: Konica Corporation; Mitsubishi Kasei Corporation, Japan

[21] Appl. No.: 924,377

[22] Filed: Jul. 31, 1992

Related U.S. Application Data

[63] Continuation of Ser. No. 516,511, Apr. 30, 1990, abandoned.

[30] Foreign Application Priority Data

May 6, 1989 [JP] Japan ................................. 1-113920
May 9, 1989 [JP] Japan ................................. 1-115280

[51] Int. Cl.$^5$ ........................ G03F 7/021; G03C 1/54; G03C 1/77
[52] U.S. Cl. ..................... 430/161; 430/157; 430/163; 430/175; 430/176; 430/278; 430/280; 430/302; 430/906; 430/907; 430/908; 430/909; 430/910
[58] Field of Search ............ 430/163, 175, 176, 278, 430/906, 909, 910, 914, 157, 302, 908, 907, 280, 161

[56] References Cited

U.S. PATENT DOCUMENTS

| | | | |
|---|---|---|---|
| 4,123,276 | 10/1978 | Kita et al. | 430/175 |
| 4,179,292 | 12/1979 | Klupfel et al. | 430/175 |
| 4,467,027 | 8/1984 | Yamamoto et al. | 430/175 |
| 4,542,085 | 9/1985 | Takahashi et al. | 430/175 |
| 4,687,727 | 8/1987 | Toyama et al. | 430/175 |
| 4,701,399 | 10/1987 | Nagano et al. | 430/175 |
| 4,826,753 | 5/1989 | Higashi et al. | 430/175 |
| 5,047,309 | 9/1991 | Koike et al. | 430/175 |

FOREIGN PATENT DOCUMENTS

| | | |
|---|---|---|
| 2924294 | 12/1979 | Fed. Rep. of Germany . |
| 3743875 | 7/1988 | Fed. Rep. of Germany . |
| 2399047 | 2/1979 | France . |

Primary Examiner—Richard L. Schilling
Assistant Examiner—John S. Chu
Attorney, Agent, or Firm—Jordan B. Bierman

[57] ABSTRACT

Disclosed is a photosensitive composition comprising a diazo resin and a polymeric compound containing a structural unit represented by the following formula (I) in the molecule:

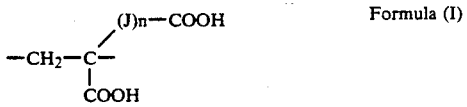

Formula (I)

wherein J represents a divalent linking group and n is 0 or 1. Disclosed is also a photosensitive lithographic printing using the photosensitive composition.

10 Claims, No Drawings

PHOTOSENSITIVE COMPOSITION AND PHOTOSENSITIVE LITHOGRAPHIC PRINTING PLATE COMPRISING IN ADMIXTURE A TETRAPOLYMER AND A DIAZO RESIN

This application is a continuation of application Ser. No. 07/516511, filed Apr. 30, 1990, now abandoned.

BACKGROUND OF THE INVENTION

This invention relates to a photosensitive composition and a photosensitive lithographic printing plate by use of said photosensitive composition.

There have been proposed various photosensitive compositions in the prior art, and these have been, for example, coated on supports and utilized as photosensitive lithographic printing plates.

As the photosensitive composition of the prior art, there is one containing an acrylic resin containing carboxylic acid group as the binder. However, such photosensitive composition involves such problem that developability when this is used for photosensitive lithographic printing plate, for example, negative type PS plate, particularly developability when stored for a long term is insufficient. Also, in recent years, printing by use of UV ink (UV-ray curable ink) is increasing, but the photosensitive lithographic printing plate by use of the above-mentioned photosensitive composition has the problem that press life is insufficient and also ink attachability is insufficient in the case of printing with such UV ink.

SUMMARY OF THE INVENTION

An object of the present invention is to solve the problems of the prior art as mentioned above, and provide a photosensitive composition which is sufficient in developability, particularly developability after storage for a long term, and sufficient in press life and also good in ink attachability also in the case of printing by use of UV ink, and a photosensitive lithographic printing plate.

The present invention is a photosensitive composition comprising a diazo resin and a polymeric compound containing the structural unit represented by the following formula (I) in the molecule and has accomplished the above object with this constitution.

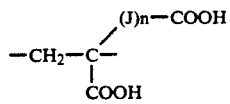

Formula (I)

wherein J represents a divalent linking groups and n is 0 or 1.

Also, the present invention is further a photosensitive lithographic printing plate containing the photosensitive composition as specified above, and has accomplished the above object by constituting in this way.

DESCRIPTION OF THE PREFERRED EMBODIMENTS

The polymeric compound containing the structural unit represented by the formula (I) contained in the photosensitive composition of the present invention is described below.

In the above formula (I), J represents a divalent linking group, preferably a straight or branched alkylene group, or an arylene group. More preferably, n is 1, and J is —CH$_2$— or —CH$_2$CH$_2$—.

The structural unit represented by the formula (I) may be also contained in the form of a derivative in the molecule. It may also include, for example, those having substituents. Thus, also derivatives of the structure represented by the formula (I) or those containing substituted structural units in the molecule are included in the present invention.

The polymeric compound containing the structural unit represented by the formula (I) as described above may be also sometimes called as the polymeric compound according to the present invention conveniently below.

In the photosensitive composition of the present invention, the polymeric compound according to the present invention can function as the binder. This polymeric compound can be permitted to act as an alkali soluble (or swellable) resin.

The polymeric compound of the present invention may be preferably an alkali soluble/swellable polymeric compound. Also, the photosensitive composition of the present invention further contains an alkali soluble/swellable and lipophilic polymeric compound.

In the present invention, alkali soluble/swellable means that the polymer is alkali soluble and/or alkali swellable. Here, what is meant by alkali soluble is that the polymer is dissolved out into an alkaline solution, for example, an alkaline solution of pH 12.0 or higher at 25° C. On the other hand, what is meant by alkali swellable is that the volume is expanded by penetration of liquid components in an alkaline solution, whereby when the solution is formed by coating on a support it becomes readily peeled off from said support.

The photosensitive composition of the present invention may also contain other polymeric compounds than the polymeric compound according to the present invention.

The polymeric compound according to the present invention and other compounds than that optionally contained in the photosensitive composition of the present invention should preferably have their weight average molecular weight of 20,000 to 500,000. More preferably, they have weight average molecular weight of 30,000 to 300,000.

The above molecular weight is obtained by GPC according to the polystyrene standard.

More specifically, measurement of weight average molecular weight can be performed by GPC (gel permeation chromatography method). Calculations of number average molecular weight MN and weight average molecular weight MW are performed by the method which averages the peaks in the oligomer region (connect the center lines between mountain and valley of peaks) as described in Morio Tsuge, Tatsuya Miyabayashi, Masayuki Tanaka "Journal of Chemical Society of Japan" p. 800–805 (1972).

Of the polymeric compounds according to the present invention, more preferable are those having the structural unit obtained from the monomer represented by the following formula (II) in the molecule.

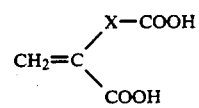

Formula (II)

In the formula (II), X is a divalent linking group.

Preferable specific examples of the compound represented by the formula (II) may include itaconic acid, 1-butene-2,4-dicarboxylic acid, 1-butene-2,3-dicarboxylic acid, 1-pentene-2,5-dicarboxylic acid, 1-pentene-2,4-dicarboxylic acid, 1-pentene-2,3-dicarboxylic acid, 1-hexene-2,6-dicarboxylic acid, etc.

The polymeric compound according to the present invention is essentially required (1) to contain the structural unit represented by the formula (I), and any polymer containing such structural unit can be used as desired, but one containing 2 to 20 mole % of the structural unit represented by the formula (I) may be preferably used. Preferable examples of the monomers which give other units than the structural unit represented by the formula (I) in the polymeric compound according to the present invention can include those represented below by (2) to (13).

(2) Monomer having an aromatic hydroxyl group, such as N-(4-hydroxyphenyl)acrylamide, N-(4-hydroxypheyl)methacrylamide, o-, m- or p-hydroxystyrene, and o-, m- or p-hydroxyphenyl-acrylate or -methacrylate.

(3) Monomer having an aliphatic hydroxyl group, such as 2-hydroxyethylacrylate or 2-2-hydroxyethyl methacrylate.

(4) Substituted or unsubstituted alkyl acrylate such as methyl acrylate, ethyl acrylate, propyl acrylate, butyl acrylate, amyl acrylate, hexyl acrylate, octyl acrylate, 2-chloroethyl acrylate, 2-hydroxyethyl acrylate, glycidyl acrylate, N-dimethylaminoethyl acrylate and the like.

(5) Substituted or unsubstituted alkyl methacrylate such as methyl methacrylate, ethyl methacrylate, propyl methacrylate, butyl methacrylate, amyl methacrylate, cyclohexyl methacrylate, 2-hydroxyethyl methacrylate, 4-hydroxybutyl methacrylate, glycidyl methacrylate, N-dimethylaminoethyl methacrylate and the like.

(6) Acrylamides or methacrylamides such as acrylamide, methacrylamide, N-methylolacrylamide, N-methylolmethacrylamide, N-ethylacrylamide, N-hexylacrylamide, N-cyclohexylacrylamide, N-hydroxyethylacrylamide, N-phenyl-acrylamide, N-nitrophenylamide, N-ethyl-N-phenylacrylamide and the like.

(7) Vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether and the like.

(8) Vinyl esters such as vinyl acetate, vinyl chloroacetate, vinyl butyrate, vinyl benzoate and the like.

(9) Styrenes such as o-methylstyrene, methylstyrene, chloromethylstyrene and the like.

(10) Vinyl ketones such as methyl vinyl ketone, ethyl vinyl ketone, propyl vinyl ketone, phenyl vinyl ketone and the like.

(11) Olefins such as ethylene, propylene, isobutylene, butadiene, isoprene and the like.

(12) N-vinylpyrrolidone, N-vinylcarbazole, 4-vinylpyridine, acrylonitrile, methacrylonitrile, etc.

(13) Carboxylic acids having unsaturated bond such as acrylic acid, methacrylic acid, maleic acid, fumaric acid, etc.

Further, the polymeric compound containing a structural unit other than that of the formula (I), which is obtained by copolymerization of monomers copolymerizable with the above-mentioned monomers may be also employed. Also, the copolymers obtained by copolymerization with the above-mentioned monomers modified with, for example, glycidyl methacrylate, glycidyl acrylate, etc. are also included within those which give other structural units than that of the formula (I), but these are not limitative of the present invention.

As the polymers according to the present invention, copolymers which further contain a structural unit derived from the monomers having a hydroxy group, i.e., the monomers set forth in the above (2) and (3), besides the structural unit represented by the formula (1), are preferable, and more preferable are the copolymers containing an aromatic hydroxyl group in its molecule.

Also, into the above-mentioned copolymer, polyvinyl butyral resin, polyurethane resin, polyamide resin, epoxy resin, novolac resin, natural resin, etc. may be added, if necessary.

As one which contains the constitution other than the structural unit of the formula (I), the copolymer as described below is particularly preferable.

That is, it is preferably a polymeric compound containing in the molecular structure:

(a) 1 to 50 mole % of structural unit having alcoholic hydroxyl group and/or structural unit having phenolic hydroxyl group, (b) 5 to 40 mole % of the structural unit represented by the following formula (III):

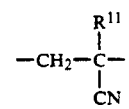

wherein $R^{11}$ represents hydrogen atom or an alkyl group), (c) 25 to 60 mole % Of the structural unit represented by the following formula (IV):

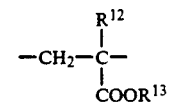

wherein $R^{12}$ represents hydrogen atom, methyl group or ethyl group, $R^{13}$ represents an alkyl group or an alkyl-substituted aryl group having 2 to 12 Carbon atoms). The copolymer may preferably have a weight average molecular weight of 30,000 to 300,000.

Specific examples of the monomer forming the structural unit having alcoholic hyroxyl group of the above (a) may include (meth)acrylates and acrylamides such as the compounds represented by the following formula (V) as disclosed in Japanese Patent Publication No. 7364/1977.

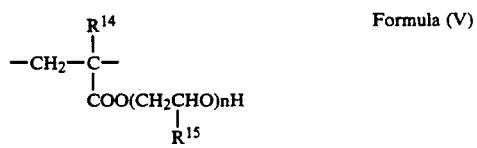

Formula (V)

wherein $R^{14}$ represents hydrogen atom Or methyl group, $R^{15}$ represents hydrogen atom, methyl group, ethyl group or chloromethyl group, and n represents an integer of 1 to 10).

Examples of (meth)acrylates may include 2-hydroxyethyl (meth)acrylate, 2-hydroxypropyl (meth)acrylate, 2-hydroxypentyl (meth)acrylate and the like, and examples of acrylamides may include N-methylol (meth)acrylamide, N-hydroxyethyl (meth)acrylamide and the like. Preferably, 2-hydroxyethyl (meth)acrylate may be employed.

As the monomer forming the structural unit having the phenolic hydroxyl group of the above (a), there may included, for example, monomers of (meth)acrylamides such as N-(4-hydroxyphenyl)-(meth)acrylamide, N-(2-hydroxyphenyl)-(meth)acrylamide, N-(4-hydroxynaphthyl)(meth)acrylamide and the like; o-, m- or p-hydroxyphenyl (meth)acrylate monomer; o-, m- or p-hydroxystyrene monomer; etc. Preferably, o-, m- or p-hydroxyphenyl (meth)acrylate monomer and N-(4-hydroxyphenyl)(meth)acrylamide monomer may be employed, more preferably N-(4-hydroxyphenyl)-(meth)acrylamide monomer.

The structural unit having alcoholic hydroxyl group and/or the structural unit having phenolic hydroxyl group as mentioned above may be selected from the range of 1 to 50 mole %, preferably 5 to 30 mole %, in the polymeric compounds. As the monomer having the cyano group in the side chain for forming the structural unit represented by the above formula (III), there may be included acrylonitrile, methacrylonitrile, 2-pentenenitrile, 2-methyl-3-butenenitrile, 2-cyanoethyl acrylate, o-, m- or p-cyanostyrene, etc. Preferably, acrylonitrile and methacrylonitrile may be employed. The ratio of said structural unit having cyano group in the side chain may be preferably selected from the range of 5 to 40 mole %, more preferably 15 to 35 mole %.

As the monomer having carboxyester group in the side chain for forming the structural unit represented by the above formula (IV), there may be included ethyl acrylate, ethyl methacrylate, propyl acrylate, butyl acrylate, amyl acrylate, amyl methacrylate, hexyl acrylate, octyl acrylate, 2-chloroethyl acrylate, 2-hydroxyethyl acrylate, glycidyl acrylate, etc. The unit formed from said monomer may be selected preferably from the range of 25 to 60 mole %, more preferably 35 to 60 mole %, among the polymeric compounds.

The respective structural units as described above are not limited to the units formed from the monomers mentioned as specific examples.

As the polymeric compound according to the present invention, for example, it is preferable to use one having the following composition. That is, it is preferable to use a composition containing 3 to 30 mole % of p-hydroxyphenylmethacrylamide (HyPMA) and/or 2-hydroxyethyl methacrylate (HEMA), 5 to 20 mole % of a monomer which gives the structural unit represented by the formula (I), 30 to 70 mole % of ethyl acrylate and 5 to 30 mole % of acrylonitrile. One with such composition can act as an alkali soluble resin.

Next, the alkali soluble/swellable and lipophilic polymeric compound (hereinafter sometimes called "lipophilic polymeric compound according to the present invention") is described.

The lipophilic polymeric compound according to the present invention is basically required to be alkali soluble/swellable. Preferably, it is alkali soluble. The definition of alkali soluble/swellable is as given above. The lipophilic polymeric compound according to the present invention is alkali soluble/swellable, and its kind may be any desired one, provided that it has lipophilicity in ordinary sense. For example, those as mentioned below can be used.

That is, as the lipophilic polymeric compound which can be used, there can be included polyamide, polyether, polyester, polycarbonate, polystyrene, polyurethane, polyvinyl chloride, and copolymers of these, and also, polyvinyl butyral resin, polyvinyl formal resin, shellac, epoxy resin, acrylic resin, etc.

As the lipophilic polymeric compounds which can be preferably used, the compounds containing at least one structural unit derived from the monomers selected from the group consisting of the above (2) to (13) and the following (14) and (15) may be included.

(14) Monomers having carboxylic group such as methacrylic acid, acrylic acid, maleic acid and the like.

(15) Acid anhydrides such as maleic anhydride, itaconic anhydride and the like.

Further, monomers copolymerizable with the above-mentioned monomers can be also copolymerized. Also, the copolymers obtained by copolymerization of the above-mentioned monomer which are modified with, for example, glycidyl methacrylate, glycidyl acrylate, etc. are also included, but these are not limitative of the present invention.

More specifically, copolymers containing the structural units comprising the monomers shown above in (4), (5) and (14) are preferred.

As the monomer composition, polymers obtained from one containing at least alkyl methacrylate which may also have substituent of the above (5) and/or alkyl acrylate which may also above substituent of the above (4) are preferred.

Further, copolymers having weight average molecular weights of 3,000 to 300,000, more preferably 6,000 to 200,000 are preferable.

Otherwise, monomers represented by the formulae (III) to (IV) as mentioned above can be used for formation of the lipophilic polymeric compound according to the present invention.

As the mixing ratio of the above polymeric compound according to the present invention and the above lipophilic polymeric compound according to the present invention, when the total of the both polymeric compounds is made 100 parts by weight, either one should preferably be contained in an amount of 10 to 90 parts by weight, preferably 20 to 80 parts by weight.

In practicing the present invention, in the polymeric compound of the photosensitive composition or the photosensitive lithographic printing plate, other polymeric compounds than the polymeric compound according to the present invention can be contained. However, in this case, the polymeric compound according to the present invention should be preferably contained in an amount of 100 to 20 mole %. When the alkali soluble/swellable and lipophilic polymeric compound according to the present invention is contained, it is preferable that the total of the polymeric compound according to the present invention and the alkali soluble/swellable and lipophilic polymeric compound should be contained in an amount of 100 to 20 mole %.

As the polymeric compounds which can be used in combination with the polymeric compound according to the present invention, polymers or copolymers mentioned above in (2) to (13), and also polymers or copolymers having the structural units represented by the above formulae (III) to (V), etc. can be included.

The polymeric compound according to the present invention contained in the photosensitive composition of the present invention and other polymeric compounds optionally contained may be contained generally in amounts of 40 to 99 by weight as the total, more preferably 50 to 95 % by weight in the solids of the photosensitive composition.

In the photosensitive composition of the present invention, various photosensitive compounds can be incorporated.

For example, a diazo resin can be preferably incorporated.

The diazo resin which can be used in the present invention may be any desired one.

In the present invention, as the diazo resin, a co-condensed diazo resin containing an aromatic diazonium compound and an aromatic compound having at least one of a carboxyl group and a hydroxyl group as the structural units can be preferably used.

Such aromatic compound containing carboxyl group and/or hydroxyl group contains an aromatic ring substituted with at least one carboxyl group and/or an aromatic ring substituted with at least one hydroxyl group in the molecule, and in this case, the above-mentioned carboxyl group and hydroxyl group may be substituted either on the same aromatic ring or on different aromatic rings. The carboxyl group or hydroxyl group may be bonded directly or through a linking group to the aromatic ring. As the aromatic group as mentioned above, preferably aryl groups such as phenyl group and naphthyl group may be included.

In the co-condensed diazo resin which can be used in the present invention as described above, the number of carboxyl groups bonded to one aromatic ring should be preferably 1 or 2, and the number of hydroxyl groups bonded to one aromatic ring should be preferably 1 to 3. When the carboxyl group or the hydroxyl group is bonded to the aromatic ring through a linking group, as said linking group, for example, alkylene groups having 1 to 4 carbon atoms can be included.

Specific examples of the aromatic compounds having carboxyl group and/or hyroxyl group as the structural unit of the above-mentioned co-condensed diazo resin may include benzoic acid, o-chlorobenzoic acid, m-chlorobenzoic acid, p-chlorobenzoic acid, phthalic acid, terephthalic acid, diphenylacetic acid, phenoxyacetic acid, p-methoxyphenylacetic acid, p-methoxybenzoic acid, 2,4-dimethoxybenzoic acid, 2,4-dimethylbenzoic acid, p-phenoxybenzoic acid, 4-anilinobenzoic acid, 4-(m-methoxyanilino)benzoic acid, 4-(p-methylbenzoyl)benzoic acid, 4-(p-methylanilino)benzoic acid, 4-phenylsulfonylbenzoic acid, phenol, (o, m, p)-cresol, xylenol, resorcin, 2-methylresorcin, (o, m, p)-methoxyphenol, m-ethoxyphenol, catechol, fluoroglycine, p-hydroxyethylphenol, naphthol, pyrogallol, hydroquinone, p-hydroxybenzyl alcohol, 4-chlororesorcin, biphenyl-4,4'-diol, 1,2,4-benzenetriol, bisphenol A, 2,4-dihydroxybenzophenone, 2,3,4-trihydroxybenzophenone, p-hydroxyacetophenone, 4,4-dihydroxydiphenyl ether, 4,4'-dihydroxydiphenylamine, 4,4'-dihydroxydiphenyl sulfide, cumyl phenol, (o, m, p)-chlorophenol, (o, m, p)-bromophenol, salicylic acid, 4-methylsalicylic acid, 6-methylsalicylic acid, 4-ethylsalicylic acid, 6-propylsalicylic acid, 6-laurylsalicylic acid, 6-stearylsalicylic acid, 4,6-dimethylsalicylic acid, p-hydroxybenzoic acid, 2- methyl-4-hydroxybenzoic acid, 6-methyl-4-hydroxybenzoic acid, 2,6-dimethyl-4-hydroxybenzoic acid, 2,4-dihydroxybenzoic acid, 2,4-dihydroxy-6-methylbenzoic acid, 2,6-dihydroxybenzoic acid, 2,6-dihydroxy-4-benzoic acid, 4-chloro-2,6-dihydroxybenzoic acid, 4-methoxy-2,6-dioxybenzoic acid, gallic acid, fluoroglucine carboxylic acid, 2,4,5-trihydroxybezoic acid, m-galloylgallic acid, tannic acid, m-benzoylgallic acid, m-(p-toluyl)gallic acid, protocatechoyl gallic acid, 4,6-dihydroxyphthalic acid, (2,4-dihydroxyphenyl)acetic acid, (2,6-dihydroxyphenyl)acetic acid, (3,4,5-trihydroxyphenyl)acetic acid, p-hydroxymethylbenzoic acid, p-hydroxyethylbenzoic acid, 4-(p-hydroxyphenyl)methylbenzoic acid, 4-(o-hydroxybenzoyl)benzoic acid, 4-(2,4-dihydroxybenzoyl)-benzoic acid, 4-(p-hydroxyphenoxy)benzoic acid, 4-(p-hydroxyanilino)benzoic acid, bis(3-carboxy-4-hydroxyphenyl)amine, 4-(p-hydroxyphenylsulfonyl)-benzoic acid, 4-(p-hydroxyphenylthio)benzoic acid, etc. Among them, particularly preferable are salicylic acid, p-hydroxybenzoic acid, p-methoxybenzoic acid, m-chlorobenzoic acid.

For the aromatic diazonium compound which is the structural unit of the above-mentioned co-condensed diazo resin, the diazomium salts as mentioned in Japanese Patent Publication No. 48001/1974 can be used, particularly preferably diphenylamine-4-diazonium salts. Diphenylamine-4-diazonium salts are derived from 4-amino-diphenylamines, and examples of such 4-amino-diphenylamines may include 4-aminodiphenylamine, 4-amino-3-methoxy-diphenylamine, 4-amino-2-methoxy-diphenylamine, 4'-amino-2-methoxy-diphenylamine, 4'-amino-4-methoxydiphenylamine, 4-amino-3-methyldiphenylamine, 4-amino-3-ethoxydiphenylamine, 4-amino-3-β-hydroxyethoxydiphenylamine, 4-amino-diphenyl-amine-2-sulfonic acid, 4-aminodiphenylamine-2-carboxylic acid, 4-amino-diphenylamine-2'-carboxylic acid, etc. Particularly preferable are 3-methoxy-4-amino-diphenylamine, 4-amino-diphenylamine.

As the co-condensed diazo resin which can be used in the present invention, those represented by the following formula (VI) are preferred.

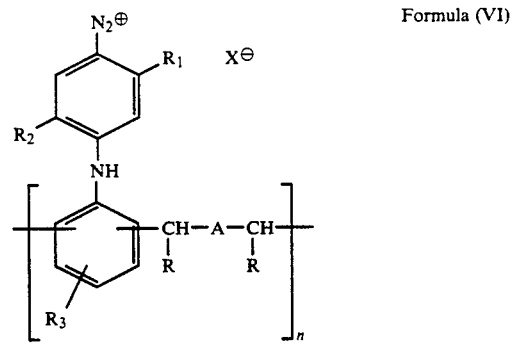

Formula (VI)

In the formula (VI), A is a group derived from an aromatic compound having at least one of carboxyl group or hydroxyl group, and as such aromatic compound, those as exemplified above can be included.

In the formula, $R_1$, $R_2$ and $R_3$ each represent hydrogen atom, an alkyl group or phenyl group, R represents hydrogen atom, an alkyl group or phenyl group, and X represents a counter anion. n represents a number preferably of 1 to 200.

When a co-condensed diazo resin is used in the present invention, it is more preferable to use a condensed diazo resin comprising an aromatic diazonium compound condensed therein in combination.

In this case, the co-condensed diazo resin should be preferably used in an amount of 5% by weight or more in the diazo resin, and the condensed diazo resin in an amount of 95% by weight or less in the diazo resin. Further in this case, the weight % ratio of the co-condensed diazo resin:condensed diazo resin should be particularly desirably 30 to 70:70 to 30 from the point of making both sensitivity and developability excellent.

The above-mentioned co-condensed diazo resin, and the condensed diazo resin used in combination with this, or independently as the diazo resin, can be obtained according to the known methods, for example, the methods as described in Photographic Science and Engineering (Photo. Sci. Eng.) Vol, 17, p. 33 (1973), U.S. Pat. Nos. 2,063,631 and 2,679,498, by polycondensing aromatic compounds having diazonium salt, carboxyl and hydroxyl groups with aldehydes, such as paraformaldephyde, acetaldehyde and benzaldehyde or ketones, such as acetone and acetophenone in sulfuric acid, phosphoric acid or hydrochloric acid.

Also, these aromatic compounds having carboxyl group and/or hydroxyl group in the molecule, aromatic diazo compounds and aldehydes or ketones can be freely combined, and further co-condensation of two or more kinds of the respective components in mixtures is also possible.

The charged molar ratio of the aromatic compound having at least one of carboxyl group and hyroxyl group and the aromatic diazonium compound may be preferably 1:0.1 to 0.1:1, more preferably 1:0.5 to 0.2:1, further preferably 20 1:1 to 0.2:1. In this case, the total of the aromatic compound, having at least one of carboxyl group and hydroxyl group, and the aromatic diazonium compound and the aldehydes or ketones may be generally charged preferably at a molar ratio of 1:0.6 to 1.2, more preferably 1:0.7 to 1.5, to carry out the reaction at low temperature for short time, for example, about 3 hours, whereby a co-condensed diazo resin can be obtained.

The counter anion of the above-mentioned diazo resin may include anions which can form stably salts with said diazo resin, and make said resin soluble in organic solvents. Those which form such anions may include organic carboxylic acids such as decanoic acid and benzoic acid, organic phosphoric acids such as phenylphosphoric acid, etc. and sulfonic acids, and typical examples thereof may include aliphatic and aromatic sulfonic acids such as methanesulfonic acid, chloroethanesulfonic acid, dodecanesulfonic acid, benzenesulfonic acid, toluenesulfonic acid, mesitylenesulfonic acid, and anthraquinonesulfonic acid, 2-hydroxy-4-methoxybenzophenone-5-sulfonic acid, hydroxysulfonic acid, 4-acetylbenzenesulfonic acid, dimethyl-5-sulfoisophthalate, etc.; hydroxyl group containing aromatic compounds such as 2,2',4,4'-tetrahydroxybenzophenone, 1,2,3-trihydroxybenzophenone, 2,2',4-trihydroxy-benzophenone, etc.; halogenated Lewis acids such as hexafluorophosphoric acid, tetrafluoroboric acid, etc.; perhalogenic acids such as $ClO_4$, $IO_4$, etc. However, these are not limitative of the present invention. Among them, particularly preferable are hexafluorophosphoric acid, 2-hydroxy-4-methoxybenzopheone-5-sulfonic acid.

The co-condensed diazo resin as described above can be obtained to have its molecular weight of any desired value by varying variously the mole ratio of the respective monomers and the condensation conditions. Generally in the present invention, one having preferably a molecular weight of about 400 to 10,000, more preferably about 800 to 5,000 is suitable.

Also, in the present invention, other than the co-condensed diazo resins, those preferably used as the diazo resin may include, for example, diazo resins obtained by condensation of diazo compounds and active carbonyl compounds, such as formaldehyde, acetaldehyde or benzaldehyde, etc. in an acidic medium such as sulfuric acid, phosphoric acid, hydrochloric acid, etc. of which preparation methods are described in Photographic Science and Engineering (Photo. Sci. Eng.) Vol, 17, P. 33 (1973) supra, and U.S. Pat. Nos. 2,063,631, 2,679,498 and 3,050,502, Japanese Unexamined Patent Publication No. 78340/1984, etc., and diazo compounds and diphenyl resins, etc. of which preparation methods are disclosed in Japanese Patent Publication No. 4001/1974.

Among those mentioned above, the diazo resin preferably used in the present invention is one represented by the following formula (VII), and yet containing 20 mole % or more, more preferably 20 to 60 mole %, of the resin wherein n in each formula is 5 or more. In the formula, $R_1$ to $R_3$ and R, X, n have the same meanings as in the above formula (VI). In the formula (VII), as the alkyl groups and the alkoxy groups of $R_1$, $R_2$ and $R_3$, for example, alkyl groups having 1 to 5 carbon atoms and alkoxy groups having 1 to 5 carbon atoms may be included, as the alkyl group of R, alkyl groups having 1 to 5 carbon atoms may be included.

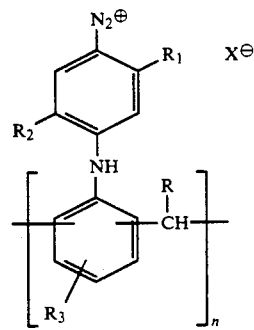

Formula (VII)

Such photosensitive diazo resin can be prepared according to the known methods, for example, the methods in the above-mentioned Photographic Science and Engineering and other respective U.S. Patents cited above, etc.

In carrying out polycondensation of a diazonium salt and an aldehyde, both may be charged generally at a molar ratio of 1:0.6 to 1:2, preferably 1:0.7 to 1:1.5, at a low temperature for a short time, for example, at 10° C. or lower and for about 3 hours to give a high sensitivity diazo resin.

As the counter anion of the diazo resin represented by the formula (VII), the same ones as mentioned as the counter anions for the above-mentioned co-condensed diazo resin may be included.

In practicing the present invention, the photosensitive composition or the photosensitive layer of the photosensitive lithographic printing plate should preferably contain 3 to 50% by weight, more preferably 3 to 30% by weight of a diazo resin as the photosensitive substance.

The photosensitive composition of the present invention can contain any desired organic acid, inorganic acid, acid anhydride.

As the organic acid, any one may be available, preferably an acid having at least one carboxyl group of monocarboxylic acid and polycarboxylic acid. Malic acid, tartaric acid and polyacrylic acid (those commercially available as trade name Julimer, etc.) can be preferably used.

As the inorganic acid, phosphoric acid, etc. can be used. Also, as the acid anhydride, any one may be used, including those derived from aliphatic and aromatic monocarboxylic acids such as acetic anhydride, propionic anhydride, benzoic anhydride, etc.; those derived from aliphatic and aromatic dicarboxylic acids such as succinic anhydride, maleic anhydride, glutaric anhydride, phthalic anhydride, etc.

In the photosensitive composition of the present invention, dyes, particularly dyes which become colorless from colored, or discolored by the treatment, may be incorporated. Preferably, a dye which becomes colorless from colored is contained.

In practicing the present invention, as the dyes which can be used preferably, the following ones may be included.

That is, for example, the dyes of the triphenylmethane type, the diphenylmethane type, the oxazine type, the xanthene type, the iminonaphthoquinone type, the azomethine type or the anthraquinone type as represented by Victoria Pure Blue BOH (Hodogaya Kagaku), Oil Blue #603 (Orient Kagaku Kogyo), Patent Pure Blue (Sumitomo Mikuni Kagaku), Crystal Violet, Brilliant Green, Ethyl Violet, Methyl Violet, Methyl Green, Erythrocin B, Basic Fuchsin, Malachite Green, Oil Red, m-Cresol Purple, Rhodamine B, Auramine, 4-p-Dimethylaminophenylimino-naphthoquine, Cyano-p-diethylaminophenylacetanilide, etc. may be included as examples of dyes which are discolored from colored to colorless or differently colored.

Particularly preferably, the triphenylmethane type and the diphenylmethane type dyes may be effectively used, more preferably the triphenylmethane dyes, particularly preferably Victoria Pure Blue BOH.

The above-mentioned discoloration agent should be preferably contained in the photosensitive composition generally in an amount of about 0.5 to about 10% by weight, more preferably about 1 to 5% by weight.

In the photosensitive composition of the present invention, further various additives may be added.

Also, alkyl ethers (e.g. ethyl cellulose, methyl cellulose), fluorine surfactants or nonionic surfactants [e.g. Pluronic L-64 (Asahi Denka K.K.)] for improvement of coatability, plasticizers for imparting flexibility and abrasion resistance to the coating (e.g. buthylphthalyl, polyethylene glycol, tributyl citrate, diethyl phthalate, dibutyl phthalate, dihexyl phthalate dioctyl phthalate, ricresyl phosphate, tributyl phosphate, trioctyl phosphate, tetrahydrofurfuryl oleate and oligomers and polymers of acrylic acid or methacryic acid), fat-sensitizer for improvement of fat sensitivity of image portion (e.g. half-esterified product of styrene-maleic anhydride copolymer with alcohol as disclosed in Japanese Unexamined Patent Publication No 527/1980), stabilizers such as phosphoric acid, phosphorous acid, organic acids (e.g. citric acid, oxalic acid, benzenesulfonic acid, naphthalenesulfonic acid, 4-methoxy-2-hydroxybenzophenone-sulfonic acid, tartaric acid, etc.), etc. may be included. The amount of these additives added may differ depending on the object to which it is added and the purpose of use, but may be generally preferred to be 0.0 to 30% by weight based on the total solids.

Next, the photosensitive lithographic printing plate of the present invention is described. The photosensitive lithographic printing plate has a photosensitive layer containing the photosensitive composition of the present invention on a support.

For providing the photosensitive composition on a support, there can be used the means in which the polymeric compound constituting the photosensitive composition as described above and other additives, etc. are dissolved in predetermined amounts in an appropriate solvent (methyl cellosolve, ethyl cellosolve, methyl cellosolve acetate, acetone, methyl ethyl ketone, methanol, dimethylformamide, dimethyl sulfoxide, water or mixtures of these, etc.) to prepare a coating solution of the photosensitive composition, and this is coated and dried on a support. The concentration of the photosensitive composition in carrying out coating should be desirably made 1 to 50% by weight. In this case, the amount of the photosensitive composition coated may be preferably made about 0.2 to 10 $g/m^2$.

In the photosensitive lithographic printing plate of the present invention, as the support for forming a photosensitive layer by coating of the photosensitive composition, various materials can be used. Particularly, aluminum plate is preferred. However, when an aluminum plate is used without treatment, adhesion of the photosensitive composition is poor, to involve the problem that the photosensitive composition is decomposed. For avoiding this problem, various proposals have been made in the prior art.

For example, after sand blasting of the surface of aluminum plate, there may be included the method of treating with silicate (U.S. Pat. No. 2,714,066), the method of treating with organic acid salt (U.S. Pat. No. 2,714,066), the method of treating with phosphonic acid and derivatives thereof (U.S. Pat. No. 3,220,832), the method of treating with potassium hexafluorozirconic acid (U.S. Pat. No. 2,946,683), the method of anodic oxidation and the method of treating with an aqueous alkali metal silicate solution after anodic oxidation (U.S. Pat. No. 3,181,461), etc.

In the preferable embodiment of the present invention, the aluminum plate (including alumina laminated plate, hereinafter the same) is defatted on its surface, then applied with sand blasting by the brush abrading method, the ball abrading method, the chemical abrading method, the electrolytic etching method, etc., preferably sand blasting by the electrolytic etching method which can give deep and homogeneous sand blasting. The anodic oxidation treatment can be performed in an aqueous solution of an inorganic salt such as of phosphoric acid, chromic acid, boric acid, sulfuric acid, etc. or an organic acid such as oxalic acid, etc., alone or a mixture of two or more kinds of these acids, preferably in an aqueous sulfuric acid, by passing current with the aluminum plate as the anode. The amount of the anodic oxidation coating should be preferably 5 to 60 $mg/dm^2$, more preferably 5 to 30 $mg/dm^2$.

In practicing the present invention, when sealing treatment is performed, this treatment is performed by dipping in an aqueous sodium silicate solution preferably of a concentration of 0.1 to 3% at 80° to 95° C. for 10 seconds to 2 minutes. More preferably, the treatment is carried out by dipping thereafter in water of 40° to 95° C. for 10 seconds to 2 minutes.

According to a further preferable embodiment, as the support constituting the photosensitive lithographic printing plate of the present invention, one with its surface being electrolytically roughened in nitric acid or an electrolyte solution composed mainly of nitric acid, and as the material of such support, various materials can be employed. Particularly, aluminum plate and alumina laminated plates are preferable, and an aluminum plate subjected to the sand blasting treatment by the above-mentioned electrolytic surface roughening is preferred.

As the base material of the aluminum plate preferably used for the photosensitive lithographic printing plate, in addition to pure aluminum, aluminum alloys may be included. Aluminum alloys can also contain minute amounts of silicon, iron, copper, zinc, manganese, magnesium, chromium, bismuth, calcium, indium, gallium, boron, nickel, etc., but one with a purity of aluminum of 95% or higher is preferable.

The thickness of such aluminum plate may be generally selected so that it may have necessary strength, resistant force, elongation, etc. when mounted on a printing machine as lithographic printing plate, practically 0.1 to 0.5 mm, and should preferably selected suitably within this range.

In the present invention, the surface of the support may be electrolytically roughened in nitric acid or an electrolyte composed mainly of nitric acid, thereby effecting the so-called sand blasting treatment, but preferably be subjected further to the anodic oxidation treatment, and also the surface treatment such as sealing treatment, etc., if necessary, is used. Also, prior to the electrolytic surface roughening, mechanical surface roughening treatment may be also effected.

As the method for mechanical surface roughening, there are the ball graining method, the wire graining method, the brush graining method, or the liquid horning method, etc.

As the abrasive to be used in the above-mentioned liquid horning method, alumina, carborundum can be used.

Preferable embodiments of the liquid horning method, as disclosed in Japanese Unexamined Patent Publication No. 77405/1976 and Japanese Patent Publication No. 42282/1979, etc., which perform liquid horning in the first stage with an abrasive having relatively rougher grain size, and then liquid horning in the second stage with an abrasive having relatively finer grain size. In this case, the grain size of the abrasive to be used for liquid horning in the first stage may be suitably made about 150 to 280 mesh for accomplishing the size of sand blasting as mentioned above, and the grain size of the abrasive to be used for liquid horning in the second stage suitably made 1,000 to 3,000 mesh.

In carrying out the abrading treatment, it is preferable to defat and wash, for example, the above-mentioned aluminum plate constituting the support beforehand. As the defatting treatment, there may be included, solvent defatting which removes contamination by use of a petroleum type solvent or a chlorinated hydrocarbon such as trichloroethylene, perchloroethylene, etc.; emulsion defatting by use of an emulsified solution comprising a nonionic surfactant, a solvent such as trichloroethylene, kerosine, etc. and water; alkali defatting which boils with a treating solution containing an alkaline chemical; electrolytic defatting, etc.

When electrolytic surface roughening is performed after mechanical surface roughening as described above, it is preferable to subject previously the surface of the aluminum plate, etc. constituting the support to chemical etching. Such chemical etching has the action of removing abrasives, aluminum dust, etc. encroached on the surface of the aluminum plate mechanically roughened, etc., and can accomplish the electrochemical surface roughening applied thereafter more uniformly and effectively. Details of such chemical etching method are described in U.S. Pat. No. 3,834,998. That is, this is the method in which the support material such as aluminum, etc. is dipped in a solution which can dissolve such material, for example, an aqueous solution of an acid or an alkali. Examples of the above-mentioned acid may include sulfuric acid, hydrofluoric acid, phosphoric acid, nitric acid, hydrochloric acid, etc., and examples of the above-mentioned alkali may include sodium hydroxide, potassium hydroxide, sodium tertiary phosphate, potassium tertiary phosphate, sodium aluminate, sodium metasilicate, sodium carbonate and the like. Particularly, the method of using an aqueous alkali solution is preferable, because the etching rate is faster.

Electrolytic surface roughening is performed in nitric acid or an electrolyte composed mainly of nitric acid, and the electrolyte used in this case should preferably contain 0.1 to 0.5 mole/liter, more preferably 0.2 to 0.4 mole/liter of nitric acid, and it is preferable to dip a support material such as aluminum plate, etc. in a bath containing such electrolyte and effect electrolytic etching at a temperature of 20° to 50° C., more preferably 25° to 40° C., at a current density of 20 to 200 A/dm$^2$, generally for about 10 seconds to 3 minutes. After the sand blasting treatment by such electrolytic surface roughening, if necessary, desmutting treatment can be performed with an aqueous alkali or acid solution, followed by washing with water.

On the surface of a support material such as aluminum plate, etc. subjected to electrolytic surface roughening treatment, smut is sometimes formed, and for removing such smut, it is preferable to apply desmutting treatment after the above treatment. Such desmutting treatment can be performed by contacting the surface of aluminum plate with an aqueous solution of acid or alkali by, for example, the method of dipping treatment, etc. As the acid to be used in the above desmutting treatment, phosphoric acid, sulfuric acid, chromic acid, etc. may be included, while as the alkali, the same ones as used in the chemical etching treatment as previously explained may be used.

The support material such as aluminum plate, etc. to be used in the present invention should preferably subsequently subjected to the anodic oxidation treatment in an electrolyte of acid such as phosphoric acid, sulfuric acid or oxalic acid, etc. For example, it is preferable to perform anodic oxidation treatment of an aluminum plate in an aqueous solution containing 10 to 50% by weight, preferably 20 to 40% by weight of sulfuric acid or phosphoric acid, or in an aqueous solution containing mixed acids of such sulfuric acid or phosphoric acid with not more than 25% by weight, preferably not more than 10% by weight of other acids, such as nitric acid, oxalic acid, etc., under the conditions of a bath temperature of 10° to 50° C., preferably 25° to 45° C., a current density of 0.2 to 10 A/dm$^2$, preferably 1 to 7 A/dm$^2$, in the range from 10 to seconds to 10 minutes, preferably from 20 seconds to 3 minutes. In this case, the amount of the anodically oxidized film amount of the anodically oxidized layer may be suitably 5 to 70 mg/dm$^2$, preferably 10 to 40 mg/dm$^2$.

Here, the anodically oxidized film amount can be determined by dipping the aluminum plate in, for example, a phosphoric acid-chromic acid solution (formed by dissolving 35 ml of aqueous phosphoric acid and 20 g of chromic oxide (VI) in one liter of water) to dissolve the oxidized film, and measuring the weight change before and after film dissolution of the plate.

In practicing the present invention, when sealing treatment is performed, there may be included the boiling water treatment, the water vapor treatment, the sodium silicate treatment, the aqueous bichromate treatment, etc. as such sealing treatment. Otherwise, it is also possible to apply subbing treatment on an aluminum support with an aqueous solution of a water-soluble polymeric compound, a metal salt such as zirconic fluoride, etc.

The photosensitive lithographic printing plate can be exposed and developed according to the conventional methods of the prior art. For example, it can be exposed through a transparent original having line image, dot image, etc., and then developed with an aqueous developer, whereby a negative relief image relative to the original can be obtained. As the light source suitable for exposure, carbon arc lamp, mercury lamp, xenon lamp, metal halide lamp, strobo, etc. may be employed.

The developer for developing the photosensitive composition of the present invention and/or the photosensitive lithographic printing plate of the present invention by use of said photosensitive composition may be any desired one, provided that it can develop them.

Preferably, a developer containing a specific organic solvent, an alkali agent and water as essential components can be used. Here, the specific organic solvent refers to one which can dissolve or swell the unexposed portion (non-image portion) of the layer comprising the photosensitive composition of the present invention, and yet is an organic solvent with a solubility in water of 10% by weight or less at normal temperature (20° C.). As such organic solvent, any one having the characteristics as mentioned above may be available, and non-limiting examples may include, for example, carboxylic acid esters such as ethyl acetate, propyl acetate, butyl acetate, amyl acetate, benzyl acetate, ethylene glycol monobutyl acetate, butyl lactate, butyl levulinate, etc.;
 ketones such as ethyl butyl ketone, methyl isobutyl ketone, cyclohexanone, etc.;
 alcohols such as ethylene glycol monobutyl ether, ethylene glycol benzyl ether, ethylene glycol monophenyl ether, benzyl alcohol, methylphenyl-carbinol, n-amyl alcohol, methylamyl alcohol, etc.;
 alkyl-substituted aromatic hydrocarbons such as xylene, etc.;
 halogenated hydrocarbons such as methylene dichloride, ethylene dichloride, monochlorobenzene, etc.; and so on. These organic solvent may be used as one kind or more. Among these organic solvents, ethylene glycol monophenyl ether and benzyl alcohol are particularly effective. The content of these organic solvents may be preferably about 1 to 20% by weight, and more preferable results can be obtained particularly when it is 2 to 10% by weight.

On the other hand, as the preferable alkali agent to be contained in the developer, there may be included:
 (A) inorganic alkali agents such as sodium silicate, potassium silicate, potassium hydroxide, sodium hydroxide, lithium hydroxide, sodium secondary or tertiary phosphate, sodium carbonate, ammonium, etc.;
 (B) organic amine compounds such as mono-, di- or tri-methylamine, mono-, di- or tri-ethylamine, mono- or di-isopropylamine, n-butylamine, mono-, di- or tri-ethanolamine, mono-, di- or tri-isopropanolamine, ethyleneimine, ethylenediamine, etc.

The content of these alkali agents in the developer may be generally preferred to be 0.05 to 4% by weight, more preferably 0.5 to 2% by weight.

For enhancing storage stability, press life, etc. higher, a water-soluble sulfite may be preferably contained in the developer. As such water-soluble sulfites, alkali or alkaline earth metal salts of sulfurous acid are preferable, as exemplified by sodium sulfite, potassium sulfite, lithium sulfite, magnesium sulfite and the like. The content of these sulfites in the developer composition may be generally preferred to be 0.05 to 4% by weight, more preferably 0.1 to 1% by weight.

When such developer is brought into contact with the photosensitive composition after developing exposure, or said photosensitive composition is rubbed with the developer, approximately at normal temperature to 40° C. after 10 to 60 seconds, the photosensitive composition at the non-exposed portion will be completely removed without adverse effect on the exposed portion of the photosensitive composition layer, whereby, for example, a photosensitive lithographic printing plate can be obtained.

EXAMPLES

The present invention is described by referring to examples below. As a matter of course, the present invention is not limited by the respective Examples shown below at all.

Prior to specific description of Examples, the polymeric compounds and the diazo resins to be used in the respective examples are to be described.

Synthesis of Polymeric Compound (1)

Under nitrogen stream, in a solvent mixture of 65 g of acetone and 65 g of methanol were dissolved 17.7 g of p-hydroxyphenylmethacryamide (HyPMA), 57.0 g of ethyl acrylate (EA), 12.7 g of acrylonitrile (AN), 11.7 g of itaconic acid (IA), and 1.64 g of azobisisobutyronitrile, and the mixture was refluxed under stirring at 60° C. for 6 hours. After completion of the reaction, the reaction mixture was thrown into water to precipitate the polymeric compound. This was recovered by filtration, and dried at 50° C. under vacuum for one day.

The polymeric compound obtained was dissolved in tetrahydrofuran (THF), and the weight average molecular weight was measured by gel permeation chromatography (GPC: polystryrene standard) to be 80,000.

Synthesis of Polymeric Compounds (2) TO (10)

According to the same method as described above, polymeric compounds (2) to (10) were synthesized. The monomer composition ratios and weight average molecular weights of the respective polymeric compounds are shown in Table 1.

The polymeric compounds (1) to (7) are according to the present invention, since the structure represented by the formula (I) is introduced with itaconic acid, but the polymeric compounds (8) to (10) are for comparative purpose.

TABLE 1

| No. | IA | HyPMA | HEMA | EA | AN | MA | VP | BA | MAA | M.W. |
|---|---|---|---|---|---|---|---|---|---|---|
| (1) | 9 | 10 | — | 57 | 24 | — | — | — | — | 80,000 |
| (2) | 10 | 10 | — | 40 | 20 | 15 | 5 | — | — | 78,000 |
| (3) | 10 | 10 | — | 37 | 20 | 15 | 3 | 5 | — | 70,000 |
| (4) | 10 | — | 10 | 50 | 30 | — | — | — | — | 75,000 |
| (5) | 9 | 10 | — | 42 | 24 | 15 | — | — | — | 75,000 |
| (6) | 9 | 10 | — | 41 | 20 | 15 | 5 | — | — | 75,000 |
| (7) | 9 | 10 | — | 38 | 20 | 15 | 3 | 5 | — | 80,000 |
| (8) | — | 10 | — | 57 | 24 | — | — | — | 9 | 78,000 |
| (9) | — | 10 | — | 42 | 24 | 15 | — | — | 9 | 80,000 |
| (10) | — | 10 | — | 41 | 20 | 15 | 5 | — | 9 | 80,000 |

Numerals are mole %
"—" indicates no addition
HEMA: 2-Hydroxyethylmethacrylate
MA: Methyl acrylate
VP: N-vinyl-2-pyrrolidone
BA: Butyl acrylate
MAA: Methacrylic acid Synthesis of Lipophilic Polymeric Compound (1)

Under nitrogen gas stream, in a solvent mixture of 65 g of acetone and 65 g of methanol were dissolved 91.0 g of ethyl acrylate, 8.61 g of methacrylic acid, and 1.64 g of azobisisobutyronitrile, and the mixture was refluxed under stirring at 60° C. for 6 hours. After completion of the reaction, the reaction mixture was thrown into water to precipitate the lipophilic polymeric compound (1). This was recovered by filtration and dried at 50° C. under vacuum overnight. The lipophilic polymeric compound (1) had a weight average molecular weight of 75,000.

Synthesis of Lipophilic Polymeric Compound (2)

According to the same method as described above, the reaction was carried out with 14.2 g of p-hydroxyphenylmethacryamide, 57.2 g of ethyl acrylate, 12.04 of acrylonitrile, 5.7 g of methacrylic acid, 1.55 of azobisisobutyronitrile to obtain the lipophilic polymeric compound (2). The weight average molecular weight was 79,000.

Both the above lipophilic polymeric compounds (1) and (2) are according to the present invention.

Synthesis of Diazo Resin 1

An amount 14. 5 g (50 mmole) of p-diazodiphenylamine sulfate was dissolved in 40 g of conc. sulfuric acid under ice-cooling. Into the reaction mixture was slowly added dropwise 1.05 (35 mmole) of paraformaldehyde. During this operation, addition was conducted so that the reaction temperature did not exceed 10° C. Then, stirring was continued under ice-cooling for 2 hours. The reaction mixture, under ice-cooling, was added into 500 ml of ethanol, and the precipitates formed were separated by filtration. The precipitates were washed with ethanol, then dissolved in 100 ml of distilled water, and to the solution was added an aqueous solution having 6.8 g of zinc chloride dissolved therein. The precipitates formed were separated by filtration, then washed with ethanol and dissolved in 150 ml of distilled water. To this solution was added an aqueous solution containing 8 g of ammonium hexafluorophosphate dissolved therein, the precipitates formed were separated by filtration, washed with water and ethanol, and then dried at 25° C. under vacuum for 3 days to obtain a diazo resin 1.

Synthesis of Diazo Resin 2

An amount 3.5 g (25 mmole) of p-hydroxybenzoic acid and 21.75 (75 mmole) of p-diazodiphenylamine sulfate were dissolved in 90 g of conc. sulfuric acid under ice-cooling. Into the solution was added slowly 2.7 g (90 mmole) of paraformaldehyde. During this operation, addition was conducted so that the reaction temperature did not exceed 10° C. After the reaction mixture was stirred for 2 hours, it was added dropwise into one liter of ethanol, the precipitates formed were separated by filtration and washed with ethanol. The precipitates were dissolved in 200 ml of distilled water, and an aqueous solution containing 10.5 g of zinc chloride dissolved therein was added. The precipitates formed were collected by filtration, washed with ethanol and then dissolved in 300 ml of distilled water. Into the solution was added an aqueous solution containing 13.7 g of ammonium hexafluorophosphate dissolved therein. The precipitates formed were separated by filtration, washed with water, ethanol, and then dried at 25° C. under vacuum for one day to obtain a diazo resin 2.

Synthesis of Diazo Resin 3

In synthesis of diazo resin 2, synthesis was carried out by use of 4.2 g (25 mmole) of p-methoxybenzoic acid in place of p-hydroxybenzoic acid to obtain a diazo resin 3.

The present invention is described below by referring to Examples.

EXAMPLE 1

On an aluminum plate subjected to electrochemical graining and anodization was applied a photosensitive solution having the following composition to a coating weight after drying of 20 mg/cm$^2$ to prepare a photosensitive lithographic printing plate sample.

| | |
|---|---|
| Diazo resin 1 | 0.9 g |
| Polymeric compound (1) | 10 g |
| Polyacrylic acid (trade name Julimer AC-10L, manufactured by Nippon Junyaku K.K.) | 0.24 g |
| Victoria Pure Blue BOH (manufactured Hodogaya Kagaku K.K.) | 0.2 g |
| Ethylene glycol monomethyl ether | 190 g |

As Control, a sample by use of the polymeric compound (8) in place of the polymeric compound (1) of the above photosensitive solution was prepared (Comparative exam.1).

On the sample obtained was placed a negative transparent original, and after exposure with a metal halide lamp of 2 KW from a distance of 60 cm for 30 seconds, the sample was dipped in Konica PS-plate developer SDN-21 at 27° C. for 20 seconds, then rubbed lightly with defatted cotton, followed by development.

When the plate obtained was printed by a Heidelberg GTO printing machine, the non-image portion of the paper surface of the sample according to Example was not contaminated at all, while the non-image portion of the paper surface of the sample according to Control was partially contaminated.

Also, when exposure, developing and printing were performed as described above after forced storage of the sample after coating (temperature 55° C., 5 days), no contamination occurred at all on the non-image portion of the paper surface of the sample according to Example, but the paper surface of the sample according to Control was wholly contaminated.

When printing was performed by use of UV ink (Toka Best Cure BF Scarlet, manufactured by Toka Shikiso), although poor attachment was seen at the paper surface image portion after 3,000 sheets in the sample according to Comparative example, while in the sample according to Example, printing was possible up to 30,000 sheets.

The solid portion of the plate after exposure and development was rubbed with a sponge containing UV ink washing oil (Solfit, Kuraray) for one minute. When the density of the solid portion of the plate was measured by a densitometer (red light), the density difference before and after rubbing with the UV ink washing oil was 0.40 in the sample according to comparative example, while it was 0.15 in the sample according to Example. According to this Example, it can be understood that a product having good resistance to UV ink washing oil can be obtained.

EXAMPLES 2 TO 6 AND COMPARATIVE EXAMPLES 2 TO 3

When the same evaluations as described above were conducted by replacing the polymeric compound (1) and the diazo resin 1 in the photosensitive solution of Example 1 with those shown in Table 2, the results shown in Table 2 were obtained.

the levels of ○, Δ, x are the same as in (a).
(c) printed sheets at the point when poor attachment accompanied with film reduction or defect of the photosensitive layer at the image portion by abrasion was seen.
(d) reduction in solid density when the solid portion of the plate after exposure and development was rubbed with UV washing oil (densitometer, red light).

From Table 2, it can be seen that for Examples 1 to 6, developability without storage immediately after coating and also storage developability after forced storage are both excellent. Further, they have good UV ink press life and also good washing oil resistance, thus being excellent in UV ink adaptability. In contrast, it can be understood that all of Comparative Examples 1 to 3 are slightly inferior also in developability without storage, and markedly deteriorated in developability after forced storage. Comparative examples 1 to 3 are also inferior in UV ink press life and UV washing oil resistance.

EXAMPLE 7

An aluminum plate was defatted with an aqueous 3% sodium hydroxide solution, subjected to electrolytic etching in a 2% hydrochloric acid bath at 25° C. at a current density of $3A/dm^2$, washed with water and then subjected to anodization treatment in a 30% sulfuric acid bath under the conditions of 30° C. and 1.5 $A/dm^2$, for 2 minutes. Subsequently, sealing treatment was effected with an aqueous 1% sodium metasilicate solution at 85° C. for 30 seconds, followed by washing with water and drying, to give an aluminum plate for a lithographic printing plate.

On the aluminum plate for a lithographic printing plate was applied a photosensitive solution having the following composition to a weight after drying of 16 $mg/cm^2$ to obtain a photosensitive layer, thus preparing a photosensitive lithographic printing plate sample.

| | |
|---|---|
| Diazo resin 1 | 0.9 g |
| Polymeric compound (1) | 5.0 g |
| Lipophilic polymeric compound (1) | 5.0 g |
| Polyacrylic acid (trade name Julimer AC-10L, manufactured by Nippon Junyaku K.K.) | 0.24 g |
| Victoria Pure Blue BOH (manufactured by Hodogaya Kagaku K.K.) | 0.2 g |
| Ethylene glycol monomethyl ether | 190 g |

TABLE 2

| No. | Diazo Resin | Polymeric compound | (a) Developability | (b) Storage developability | (c) UV ink press life (sheets) | (d) UV washing oil resistance (reduction in solid density) |
|---|---|---|---|---|---|---|
| Example 1 | 1 | (1) | ○ | ○ | 30,000 | 0.15 |
| Example 2 | 2 | (1) | ○ | ○ | 30,000 | 0.15 |
| Example 3 | 3 | (1) | ○ | ○ | 32,000 | 0.14 |
| Example 4 | 1 | (5) | ○ | ○ | 30,000 | 0.14 |
| Example 5 | 1 | (6) | ○ | ○ | 35,000 | 0.14 |
| Example 6 | 1 | (7) | ○ | ○ | 35,000 | 0.12 |
| Compa. 1 | 1 | (8) | Δ | x | 3,000 | 0.40 |
| Compa. 2 | 1 | (9) | Δ | x | 5,000 | 0.38 |
| Compa. 3 | 1 | (10) | Δ | x | 5,000 | 0.37 |

(a) printed with the plate prepared immediately after coating:
  ○: no contamination at all on paper surface
  Δ: partial contamination
  x: whole contamination
(b) printed with the plate prepared after forced storage after coating:

Also, of the above composition, the diazo resin, the polymeric compound and the lipophilic polymeric compound were replaced with those shown in Table 3, followed by coating similarly on the aluminum plate for a lithographic printing plate, to provide samples for Examples 8 to 12 and Comparative examples 4 to 5.

TABLE 3

| No. | Polymeric compound | Lipophilic polymeric compound | Diazo resin |
|---|---|---|---|
| Example 7 | (1) | (1) | (1) |
| Example 8 | (1) | (2) | (1) |
| Example 9 | (1) | (2) | (2) |
| Example 10 | (2) | (2) | (1) |
| Example 11 | (3) | (2) | (1) |
| Example 12 | (4) | (2) | (1) |
| Compara. 4 | (10) | (2) | (1) |
| Compara. 5* | (1) | — | (1) |

*In Comparative examples 5, 10.0 g of polymeric compound (1) was used and no lipophilic polymeric compound was used.

On the sample obtained was placed a negative transparent original, and after exposure with a metal halide lamp of 2 KW from a distance of 60 cm for 30 seconds, the sample was dipped in Konica PS-plate developer SDN-21 (diluted to 4-fold) at 27° C. for 20 seconds, followed by rubbing lightly with defatted cotton to effect development.

The plate obtained was printed by a Heidelberg GTO printing machine, and the developability was evaluated from the state of contamination on the paper surface.

Also, exposure, development and printing were performed as described above after forced storage of the sample after coating (temperature 55° C., humidity 20% RH, 5 days), and developability after storage was evaluated.

Also, as evaluation of UV ink adaptability, printing was performed by use of UV ink (Toka Best Cure BF Scarlet, manufactured by Toka Shikiso), and printable numbers of sheets were compared.

Also, the image portion of the plate after exposure and development was rubbed with a sponge containing a UV ink washing oil (Solfit, manufactured by Kuraray) for one minute, and the density difference was measured with red light to determine the density lowering by the UV ink washing oil.

Evaluation of ink attachability was conducted as described below.

On the sample subjected to exposure and developing similarly as described above, Konica PS-plate gum solution SGQ-3 (diluted to 2-fold) was applied to carry out printing. The gum at the image portion was removed, and comparison was made about how many sheets were required before normal attachment could be obtained.

The results of evaluation are shown in Table 4.

After printing, evaluated according to the contaminate state of paper surface:
  ○: no contamination at all on paper surface
  Δ: partial contamination
  x: whole contamination b) Number of printed sheets when poor attachment accompanied with film reduction or defect of the photosensitive layer at the image portion by abrasion was seen.

As is apparent from Table 4, the samples according to the present invention are excellent in developability and storage developability, and free from contamination when provided for printing.

Also, it can be understood that the samples according to the present invention are excellent in UV ink adaptability, with strong press life when UV ink is used and difficult in occurrence of dye withdrawal with UV ink washing oil.

Further, from Table 4, the samples according to the present invention are excellent in ink attachability, and printed matters exhibiting normal attachment can be quickly obtained during printing initiation. For this reason, the amount of waste paper (printed matters with insufficient attachment) can be small.

EXAMPLES 13 TO 18 AND COMPARATIVE EXAMPLES 6 to 7

In the following Examples, as the polymeric compound, the polymeric compound (1) in the foregoing examples, and the polymeric compounds (11) to (13) shown below were employed.

Synthesis of Polymeric Compound (11)

Under nitrogen gas stream, into a solvent mixture of 65 g of acetone and 65 g of methanol were dissolved 17.7 g of p-hydroxyphenylmethacryamide (HyPMA), 41.0 g of ethyl acrylate (EA), 10.6 g of acrylonitrile (AN), 11.7 g of itaconic acid (IA), 12.9 g of methyl acrylate (MA), 5.6 g of N-vinyl-2-pyrrolidone (VP) and 1.64 g of azobisisobutyronitrile, and the mixed solution was refluxed under stirring at 60° C. for 6 hours. After completion of the reaction, the reaction mixture was thrown into water to precipitate the polymeric compound. The product was collected by filtration and dried in vacuum at 50° C. for one day.

The polymeric compound obtained was dissolved in tetrahydrofuran (THF) and the weight average molecular weight was measured by gel permeation chromatography (GPC: polystyrene standard) to be 75,000.

Synthesis of Polymeric Compound (12)

Under nitrogen gas stream, into a solvent mixture of 65 g of acetone and 65 g of methanol were dissolved 13.3 g of 2-hydroxyethyl methacrylate (HEMA), 50.0 g

TABLE 4

| No. | Developability (a) Without storage | Developability (a) After forced storage | UV ink adaptability Printable sheets (b) | UV ink adaptability Density lowering with UV ink washing oil | Ink attachability (attached sheets) |
|---|---|---|---|---|---|
| Example 7 | ○ | ○ | 20,000 | 0.16 | 14 |
| Example 8 | ○ | ○ | 27,000 | 0.15 | 17 |
| Example 9 | ○ | ○ | 25,000 | 0.14 | 18 |
| Example 10 | ○ | ○ | 30,000 | 0.14 | 18 |
| Example 11 | ○ | ○ | 30,000 | 0.12 | 15 |
| Example 12 | ○ | ○ | 30,000 | 0.13 | 19 |
| Compara. 4 | Δ | x | 3,800 | 0.38 | 22 |
| Compara. 5 | ○ | ○ | 30,000 | 0.15 | 38 | of ethylacrylate (EA), 15.9 g of acrylonitrile (AN), 11.7 g of itaconic acid (IA) and 1.64 g of azobisiso-butyronitrile, and the mixed solution was refluxed under stirring at 60° C. for 6 hours. After completion of the reaction, the reaction mixture was thrown into water to precipitate the polymeric compound. The product was collected by filtration and dried in vacuum at 50° C. for one day.

The polymeric compound obtained was dissolved in tetrahydrofuran (THF) and the weight average molecular weight was measured by gel permeation chromatography (GPC: polystyrene standard) to be 75,000.

Synthesis of Polymeric Compound (13)

Under nitrogen gas stream, into a solvent mixture of 65 g of acetone and 65 g of methanol were dissolved 17.7 g of p-hydroxyphenylmethacryamide (HyPMA), 57.0 g of ethyl acrylate (EA), 12.7 g of acrylonitrile (AN), 7.7 g of methacrylic acid (MAA), and 1.64 g of azobisisobutyronitrile, and the mixed solution was refluxed under stirring at 60° C. for 6 hours. After completion of the reaction, the reaction mixture was thrown into water to precipitate the polymeric compound. The product was collected by filtration and dried in vacuum at 50° C. for one day.

The polymeric compound obtained was dissolved in tetrahydrofuran (THF) and the weight average molecular weight was measured by gel permeation chromatography (GPC: polystyrene standard) to be 78,000.

As the diazo resin, diazo resins (1) to (3) used in Examples 1 to 12 were employed.

PREPARATION OF A SUPPORT

Four kinds of aluminum plates with different abrasion conditions were prepared. More specifically, by use of an aluminum plate with a thickness of 0.3 mm for each, after defatting by trichloroethylene washing, abrasion was effected under the conditions shown in Table 5.

In every case, desmutting treatment (50° C., for 13 seconds in 10 g/liter NaOH), anodization treatment (30° C., 6.5 A/dm$^2$, 30 seconds in 30% sulfuric acid) were performed continuously, and then each sample was dipped in an aqueous 1% sodium metasilicate solution at 85° C. for 3 minutes to effect sodium silicate treatment, followed by dipping in hot water of 90° C. for 2 minutes.

TABLE 5

| Aluminum plate No. | Mechanical roughening | Etching conditions | Electrolytic condition |
|---|---|---|---|
| (1) | — | — | HNO$_3$ (14 g/lit.) 50 A/dm$^2$, 30 sec. |
| (2) | Liquid horning *1) | NaOH (10%) 50° C., 20 sec. | HNO$_3$ (14 g/lit.) 50 A/dm$^2$, 30 sec. |
| (3) | Brush abrasion *2) | NaOH (10%) 50° C., 20 sec. | HNO$_3$ (14 g/lit.) 50 A/dm$^2$, 30 sec. |
| (4) | — | — | HCl (18 g/lit.) 50 A/dm$^2$, 30 sec. |

1) Aluminum plate was mounted on a rotatory drum, which was rotated at a circumferential speed of 12 m/min., and a mixture of 20 parts of 25 mesh alumina abrasives and 80 parts of water (volume ratio) was sprayed by means of a centrifugal type sprayer.

After washing with water, a mixture of 25 parts of 2000 mesh alumina abrasives and 75 parts of water (volume ratio) was sprayed similarly as described above.

2) Abrasion was effected by use of a nylon brush and 400 mesh pumice-aqueous suspension.

In the following, Examples are to be described.

On the aluminum plates prepared as described above, a photosensitive composition having the following composition was applied to prepare a photosensitive lithographic printing plate sample.

| | |
|---|---|
| Polymeric compound | 10 g |
| Diazo resin | 0.9 g |
| Polyacrylic acid (trade name Julimer AC-10L, manufactured by Nippon Junyaku K.K.) | 0.24 g |
| Victoria Pure Blue BOH (manufactured by Hodogaya Kagaku K.K.) | 0.2 g |
| Ethylene glycol monomethyl ether | 190 g |

The combination of the polymeric compounds and the diazo resins shown in the composition, and the aluminum plate are shown in Table 6.

TABLE 6

| No. | Aluminum plate | Polymeric compound | Diazo resin |
|---|---|---|---|
| Example 13 | (1) | (1) | (1) |
| Example 14 | (1) | (11) | (2) |
| Example 15 | (2) | (1) | (1) |
| Example 16 | (2) | (12) | (2) |
| Example 17 | (3) | (11) | (1) |
| Example 18 | (3) | (12) | (3) |
| Compara. 6 | (4) | (1) | (1) |
| Compara. 7 | (4) | (13) | (1) |

On the sample obtained, a negative transparent original was placed, and after exposure with a metal halide lamp of 2 KW from a distance of 60 cm for 30 seconds, the sample was dipped in Konica PS-plate developer SDN-21 at 27° C. for 20 seconds, followed by rubbing lightly with defatted cotton to effect development.

The plate obtained was printed by a Heidelberg GTO printing machine, and the developability was evaluated from the state of contamination on the paper surface. Also, exposure, development and printing were performed as described above after forced storage of the sample after coating (temperature 55° C., Humidity 20% RH, 5 days), and developability after storage was evaluated. Also, printing was performed by use of UV ink (Toka Best Cure BF Scarlet, manufactured by Toka Shikiso), and printable numbers of sheets were compared.

Also, the solid portion of the plate after exposure and development was rubbed with a sponge containing a UV ink washing oil (Solfit, manufactured by Kuraray) for one minute, and the density at the solid portion of the plate was measured by a densitometer (red light) to evaluate the UV ink washing oil resistance. The results are shown in Table 7.

TABLE 7

| No. | (a) Developability | (b) Storage developability | (c) UV ink press life (sheets) | (d) UV washing oil resistance (reduction in solid density) |
|---|---|---|---|---|
| Exam. 13 | ○ | ○ | 38,000 | 0.15 |
| Exam. 14 | ○ | ○ | 38,000 | 0.14 |
| Exam. 15 | ○ | ○ | 42,000 | 0.15 |
| Exam. 16 | ○ | ○ | 45,000 | 0.13 |
| Exam. 17 | ○ | ○ | 40,000 | 0.14 |
| Exam. 18 | ○ | ○ | 45,000 | 0.12 |
| Compa. 6 | ○ | ○ | 30,000 | 0.15 |
| Compa. 7 | Δ | x | 3,000 | 0.40 |

(a) printed with the plate prepared immediately after coating:

○: no contamination at all on paper surface
Δ: partial contamination x : whole contamination (b) printed with the plate prepared after forced storage after coating:

the levels of ○, Δ, x are the same as in (a).

(c) printed sheets at the point when poor attachment accompanied with film reduction or defect of the photosensitive layer at the image portion by abrasion was seen.

(d) reduction in solid density when the solid portion of the plate after exposure and development was rubbed with UV washing oil (densitometer, red light).

From Table 7, it can be understood that, for Examples 13 to 18, developability without storage immediately after coating and also storage developability after forced storage are both excellent. Further, they have good UV ink press life and good UV washing oil resistance, thus being excellent in UV ink adaptability. In contrast, it can be understood that both of Comparative examples 6 and 7 by use of a support electrolytically roughened by use of hydrochloric acid as the electrolyte solution are slightly inferior also in developability without storage, and also markedly deteriorated in developability after forced storage. Comparative examples 6 and 7 are also inferior in UV ink press life and UV washing oil resistance.

As described above, the photosensitive composition and the photosensitive lithographic printing plate are excellent in developability and storage developability, and have the effect that no contamination occurs, when provided for printing.

Also, the photosensitive composition and the photosensitive lithographic printing plate are excellent in UV ink adaptability, having the effect of strong press life when employing UV ink and difficult in dye withdrawal with UV ink washing oil.

Also, the photosensitive lithographic printing plate as described above is excellent in ink attachability, having the effect that printed matters exhibiting normal attachment can be quickly obtained on printing initiation, whereby the amount of waste paper (printed matter with insufficient attachment) can be made small.

We claim:

1. A photosensitive composition comprising, in admixture,

3% to 50% by weight, based on said composition, of a diazo resin having $PF_6$ as an anion; and 50% to 95% by weight, based on said composition, of a polymeric compound which contains 2 to 20 mol %, based on said polymeric compound, of a structural unit of

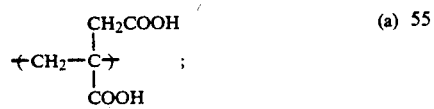
(a)

5 to 40 mol %, based on said polymeric compound, of a structural unit of

(b)

25 to 60 mol %, based on said polymeric compound, of a structural unit of

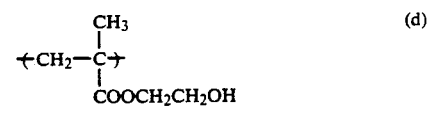
(c)

1 to 50 mol %, based on said polymeric compound, of at least one structural unit selected from the group consisting of

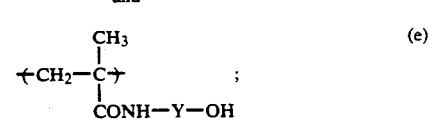
(d)

and

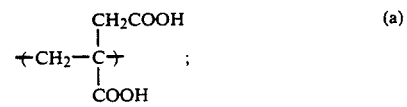
(e)

wherein $R^{13}$ is methyl, ethyl, propyl, or butyl; and Y is phenylene.

2. A photosensitive lithographic printing plate comprising:

an aluminum support and a photosensitive composition thereon;

wherein said composition comprises, in admixture,

3% to 50% by weight, based on said composition, of a diazo resin having $PF_6$ as an anion; and 50% to 95% by weight, based on said composition, of a polymeric compound which contains 2 to 20 mol %, based on said polymeric compound, of a structural unit of

(a)

5 to 40 mol %, based on said polymeric compound, of a structural unit of (b)

25 to 60 mol %, based on said polymeric compound, of a structural unit of

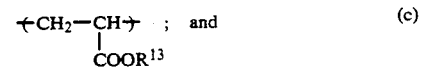
(c)

1 to 50 mol %, based on said polymeric compound, of at least one structural unit selected from the group consisting of

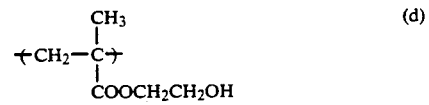
(d)

and

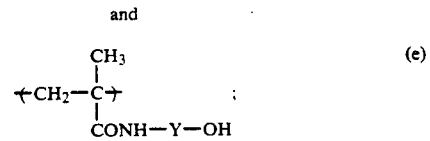
(e)

wherein $R^{13}$ is methyl, ethyl, propyl, or butyl; and Y is phenylene.

3. The photosensitive composition according to claim 1, wherein said photosensitive composition further contains a lipophilic polymeric compound other than said polymeric compound.

4. The photosensitive composition according to claim 1, wherein said polymeric compound has weight average molecular weight of 20,000 to 500,000.

5. The photosensitive composition according to claim 1, wherein said polymeric compound has weight average molecular weight of 30,000 to 300,000.

6. The photosensitive composition according to claim 3, said lipophilic polymeric compound is at least one selected from the group consisting of polyamide, polyether, polyester, polycarbonate, polystyrene, polyurethane, polyvinyl chloride, and copolymers of these; polyvinyl butyral resin, polyvinyl formal resin, shellac, epoxy resin and acrylic resin.

7. The photosensitive composition according to claim 3, said lipophilic polymeric compound has a weight average molecular weight ranging from 3,000 to 300,000.

8. The photosensitive composition according to claim 3, said lipophilic polymeric compound has a weight average molecular weight ranging from 6,000 to 200,000.

9. The photosensitive composition according to claim 3, a ration of said polymeric compound to said lipophilic polymeric compound is 10:90 to 90:10 by weight.

10. The photosensitive composition according to claim 1, wherein said diazo resin is a diazo resin containing an aromatic diazonium compound and an aromatic compound, as the structural units, having at least one of a carboxyl group and a hydroxyl group.

* * * * *